(12) United States Patent
Jung et al.

(10) Patent No.: US 10,734,544 B2
(45) Date of Patent: *Aug. 4, 2020

(54) LIGHT EMITTING DIODE APPARATUS AND MANUFACTURING METHOD THEREOF

(71) Applicant: Samsung Electronics Co., Ltd., Suwon-si, Gyeonggi-do (KR)

(72) Inventors: Jong-hoon Jung, Suwon-si (KR); Dae-sik Kim, Suwon-si (KR); Sung-yeol Kim, Suwon-si (KR); Seung-yong Shin, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/298,482

(22) Filed: Mar. 11, 2019

(65) Prior Publication Data

US 2019/0207058 A1    Jul. 4, 2019

Related U.S. Application Data

(63) Continuation of application No. 15/641,900, filed on Jul. 5, 2017, now Pat. No. 10,276,743.

(30) Foreign Application Priority Data

Feb. 14, 2017    (KR) .................. 10-2017-0020135

(51) Int. Cl.
*H01L 33/04* (2010.01)
*H01L 33/46* (2010.01)
(Continued)

(52) U.S. Cl.
CPC .......... *H01L 33/04* (2013.01); *H01L 33/0095* (2013.01); *H01L 33/46* (2013.01);
(Continued)

(58) Field of Classification Search
CPC ......... H01L 33/04; H01L 33/50; H01L 33/60; H01L 33/46; H01L 25/752; H01L 21/0262; H01L 33/62
(Continued)

(56) References Cited

U.S. PATENT DOCUMENTS 8,071,995 B2    12/2011    Sato et al.
8,889,439 B2    11/2014    Tseng et al.
(Continued)

FOREIGN PATENT DOCUMENTS

DE    10 2015 104237 A1    9/2016
JP    2012-155999 A    8/2012
(Continued)

OTHER PUBLICATIONS

European Search Report dated Jan. 20, 2020, issued in European Patent Application No. 17896621.4.

*Primary Examiner* — Thinh T Nguyen
(74) *Attorney, Agent, or Firm* — Jefferson IP Law, LLP

(57) ABSTRACT

A light emitting diode (LED) apparatus is provided. The LED apparatus includes a light emitting diode, a light conversion layer stacked on the light emitting diode and configured to convert a wavelength of light incident from the light emitting diode, a reflection coating layer stacked on the light conversion layer and configured to pass the light of which the wavelength is converted in light incident from the light conversion layer therethrough and reflecting the other light, and a color filter stacked on the reflection coating layer and configured to correspond to the light conversion layer.

8 Claims, 19 Drawing Sheets

(51) Int. Cl.
  *H01L 33/00* (2010.01)
  *H01L 33/50* (2010.01)
  *H01L 33/62* (2010.01)
  *H01L 33/60* (2010.01)
  *H01L 25/075* (2006.01)

(52) U.S. Cl.
  CPC .............. *H01L 33/50* (2013.01); *H01L 33/60* (2013.01); *H01L 33/62* (2013.01); *H01L 25/0753* (2013.01); *H01L 33/505* (2013.01); *H01L 2933/0025* (2013.01); *H01L 2933/0041* (2013.01); *H01L 2933/0066* (2013.01)

(58) Field of Classification Search
  USPC .................... 257/98, 99, 100; 438/22, 25, 26
  See application file for complete search history.

(56) References Cited

U.S. PATENT DOCUMENTS

| | | | |
|---|---|---|---|
| 9,082,942 | B2 | 7/2015 | Tseng et al. |
| 10,153,414 | B2 | 12/2018 | Halbritter et al. |
| 10,276,743 | B2 * | 4/2019 | Jung et al. .............. H01L 33/04 |
| 2006/0132021 | A1 | 6/2006 | Naberhuis et al. |
| 2011/0012147 | A1 | 1/2011 | Bierhuzien et al. |
| 2011/0127549 | A1 | 6/2011 | Lee et al. |
| 2014/0054619 | A1 | 2/2014 | Tseng et al. |
| 2014/0103372 | A1 | 4/2014 | Tseng et al. |
| 2014/0319560 | A1 | 10/2014 | Tischler |
| 2015/0053914 | A1 | 2/2015 | Kurtin et al. |
| 2015/0137163 | A1 | 5/2015 | Harris |
| 2015/0184066 | A1 | 7/2015 | Kwon et al. |
| 2015/0284627 | A1 | 10/2015 | Bohmer et al. |
| 2015/0357525 | A1 | 12/2015 | Sasaki |
| 2015/0380622 | A1 | 12/2015 | Miyoshi et al. |
| 2016/0329388 | A1 | 11/2016 | Yokota et al. |
| 2018/0076366 | A1 | 3/2018 | Halbritter et al. |
| 2018/0190625 | A1 | 7/2018 | Steckel et al. |
| 2018/0192495 | A1 | 7/2018 | Kim et al. |

FOREIGN PATENT DOCUMENTS

| | | |
|---|---|---|
| JP | 2013-254651 A | 12/2013 |
| JP | 2016-505212 A | 2/2016 |
| JP | 2016-046266 A | 4/2016 |
| KR | 10-2012-0018490 A | 3/2012 |
| KR | 10-2012-0050286 A | 5/2012 |
| KR | 10-2016-0089307 A | 7/2016 |
| TW | 201 246 630 A1 | 11/2012 |
| WO | 2011/116241 A2 | 9/2011 |

\* cited by examiner

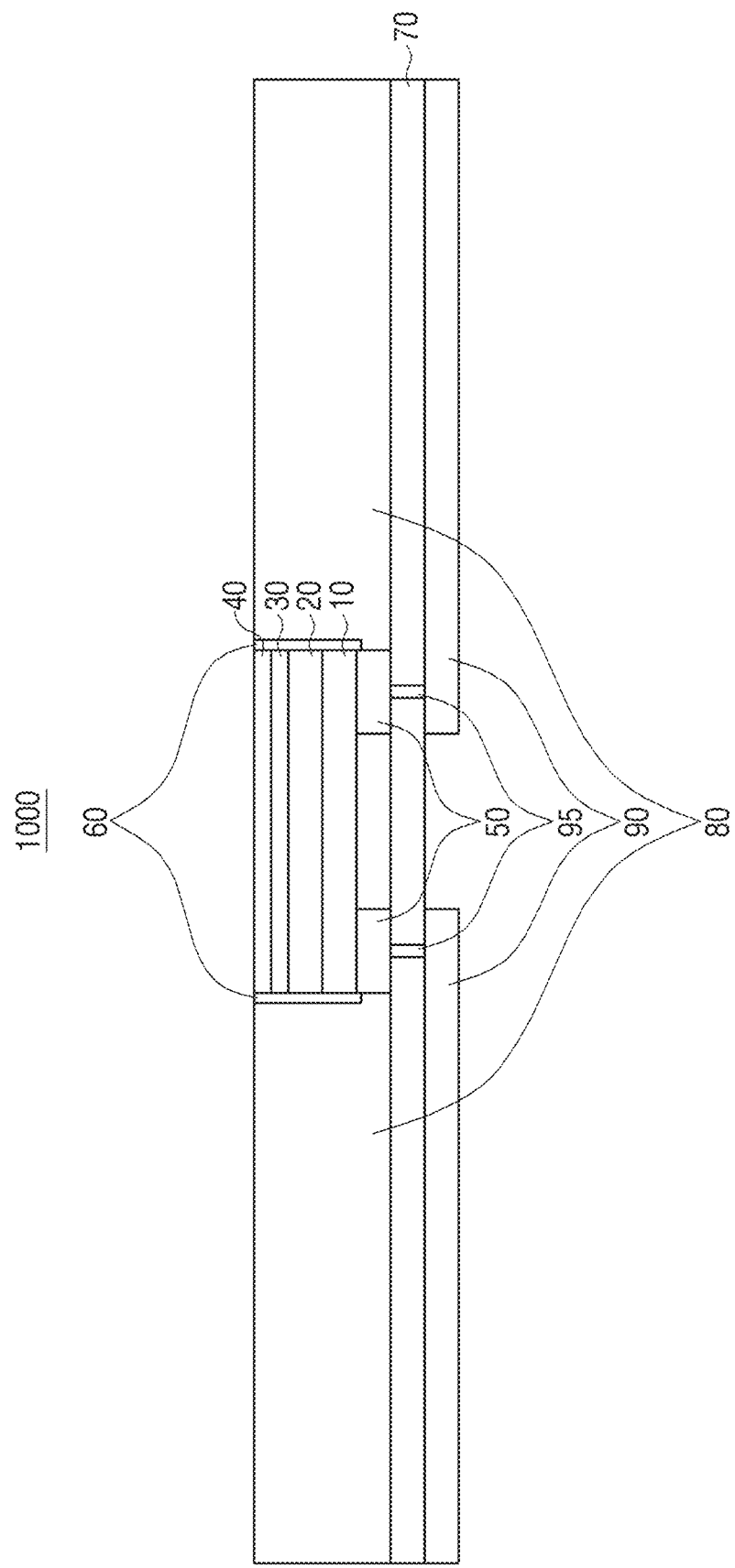

LIGHT EMITTING DIODE APPARATUS AND MANUFACTURING METHOD THEREOF

CROSS-REFERENCE TO RELATED APPLICATION(S)

This application is a continuation application of prior application Ser. No. 15/641,900, filed on Jul. 5, 2017 and which claimed under 35 U.S.C. § 119(a) of a Korean patent application number 10-2017-0020135 filed on Feb. 14, 2017 in the Korean Intellectual Property Office, the disclosure of which is incorporated by reference herein in its entirety.

TECHNICAL FIELD

The present disclosure relates to a light emitting diode (LED) apparatus and a manufacturing method thereof. More particularly, the present disclosure relates to an LED apparatus including a light converting layer, and a manufacturing method thereof.

BACKGROUND

Conventionally, red and green light emitting diodes (LEDs) are manufactured by combining a blue LED and glass packages including quantum dots corresponding to each of a red color and a green color with each other. That is, the red and green LEDs are manufactured in a scheme of covering and encapsulating the quantum dots with a glass, and convert wavelengths of blue light emitted from a lower portion by the quantum dots to express a red color and a green color, respectively. In this case, the LEDs are bonded onto a board, are connected to electrodes by gold wires, and are surrounded by a plastic mold.

When the quantum dots are bonded onto the LEDs as described above, the quantum dots vulnerable to heat are deteriorated, such that light conversion characteristics rapidly deteriorate. To solve such a problem, a material for blocking the heat is added between the LEDs and the quantum dots. However, a problem that a thickness increases occurs.

Therefore, heat resistance performance of the quantum dots needs to be improved, and a manufacturing process using a new quantum dot needs to be developed.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a light emitting diode (LED) apparatus using a light conversion layer in which a deterioration phenomenon is suppressed, and a manufacturing method thereof.

In accordance with an aspect of the present disclosure, an LED apparatus is provided. The LED apparatus includes a light emitting diode, a light conversion layer stacked on the light emitting diode and configured to convert a wavelength of light incident from the light emitting diode, a reflection coating layer stacked on the light conversion layer and configured to pass the light of which the wavelength is converted in light incident from the light conversion layer therethrough and reflecting the other light, and a color filter stacked on the reflection coating layer and configured to correspond to the light conversion layer.

The light conversion layer may be implemented by a quantum dot siloxane resin.

The light conversion layer may convert the light incident from the light emitting diode into light having a corresponding wavelength, and may diffuse and emit the light of which the wavelength is converted to the outside through a diffusion material included in the light conversion layer.

When the light having the wavelength reflected is again reflected by the light emitting diode and the wavelength is converted by the light conversion layer, the reflection coating layer may pass the light of which the wavelength is converted therethrough.

The LED apparatus may further include a plurality of pads formed beneath the light emitting diode.

The LED apparatus may further include a metallic material coated to surround side surfaces of the light emitting diode, the light conversion layer, the reflection coating layer, and the color filter to reflect light emitted to the side surfaces of the light emitting diode, the light conversion layer, the reflection coating layer, and the color filter to inner portions of the light emitting diode, the light conversion layer, the reflection coating layer, and the color filter.

The LED apparatus may further include a polyimide layer formed to surround the metallic material, a substrate layer formed beneath the light emitting diode, the plurality of pads, and the polyimide layer, a plurality of extension pads formed beneath the substrate layer to be spaced apart from each other, and a plurality of conductive materials connecting each of the plurality of pads to each of the plurality of extension pads through the substrate layer.

Each of the plurality of extension pads may correspond to each of the plurality of pads, and be extended up to some regions of the polyimide layer.

In accordance with another aspect of the present disclosure, a method of manufacturing an LED apparatus is provided. The LED method includes providing a plurality of pads beneath a light emitting diode, stacking the light emitting diode on a substrate layer so that the plurality of pads are in contact with an upper portion of the substrate layer, stacking a light conversion layer on the light emitting diode, stacking a reflection coating layer on the light conversion layer, and stacking a color filter on the reflection coating layer.

The light conversion layer may be implemented by a quantum dot siloxane resin.

The light conversion layer may convert light incident from the light emitting diode into light having a corresponding wavelength, and may diffuse and emit the light of which the wavelength is converted to the outside through a diffusion material included in the light conversion layer.

The reflection coating layer may pass light of which a wavelength is converted in light incident from the light conversion layer therethrough and reflect the other light, and when the light having the wavelength reflected is again reflected by the light emitting diode and the wavelength is converted by the light conversion layer, the reflection coating layer may pass the light of which the wavelength is converted therethrough.

The method may further include forming a light emitting diode layer beneath a sapphire substrate layer. In the providing of the plurality of pads, the light emitting diode layer is divided into a plurality of regions that are predetermined and the plurality of pads are provided in the plurality of regions, respectively, and the method may further include removing the sapphire substrate layer from the light emitting diode layer, and dicing the light emitting diode layer into the plurality of regions to form a plurality of light emitting diodes. In the stacking of the light emitting diode on the substrate layer, the plurality of light emitting diodes are stacked on the substrate layer to be spaced apart from each other by a predetermined interval.

In the stacking of the light conversion layer, the light conversion layer may be stacked to cover the plurality of light emitting diodes and an upper region of the substrate layer between the plurality of light emitting diodes, and the method may further include stacking an upper substrate layer on the color filter and removing the substrate layer, etching the light conversion layer, the reflection coating layer, and the color filter corresponding to some regions between the plurality of light emitting diodes, and coating a surface formed by the etching with a metallic material.

In the etching, some regions between the plurality of light emitting diodes may be etched in a $\wedge$ form.

The method may further include forming a lower substrate layer beneath the plurality of light emitting diodes and removing the upper substrate layer, forming a polyimide layer to surround the metallic material and fill some regions between the plurality of light emitting diodes, forming a plurality of holes in the lower substrate layer so that some regions of each of the plurality of pads are exposed, filling conductive material in the plurality of holes, respectively, and providing a plurality of extension pads beneath the lower substrate layer, the plurality of extension pads being formed to be spaced apart from each other and cover the plurality of conductive materials, respectively.

The method may further include forming a polyimide layer to surround the metallic material and fill some regions between the plurality of light emitting diodes, and providing a plurality of extension pads corresponding to the plurality of pads, respectively, and extended up to some regions of the polyimide layer.

The method may further include forming a light emitting diode layer beneath a sapphire substrate layer. In the providing of the plurality of pads, the light emitting diode layer is divided into a plurality of regions that are predetermined and the plurality of pads are provided in the plurality of regions, respectively, and the method may further include removing the sapphire substrate layer from the light emitting diode layer. In the stacking of the light emitting diode on the substrate layer, the light emitting diode layer is stacked on the substrate layer so that the plurality of pads provided in the plurality of regions, respectively, are in contact with the upper portion of the substrate layer.

The method may further include etching the light emitting diode layer, the light conversion layer, the reflection coating layer, and the color filter corresponding to boundary regions between the plurality of regions, and coating a surface formed by the etching with a metallic material.

As described above, according to the diverse embodiments of the present disclosure, the light conversion layer in which the deterioration phenomenon is suppressed is used, such that a lifespan of the LED apparatus may be increased and the LED apparatus may be produced at a smaller size and a thinner thickness, thereby making it possible to implement a display having a high resolution.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 3 is a view for describing an LED apparatus according to an embodiment of the present disclosure;

Throughout the drawings, like reference numerals will be understood to refer to like parts, components, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1A:
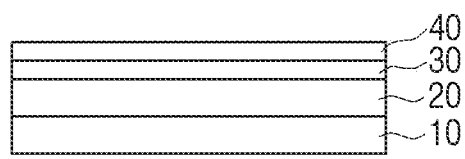
FIGS. 1A and 1B are views for describing light emitting diode (LED) apparatuses according to diverse embodiments of the present disclosure.

FIG. 1A is a view for describing a light emitting diode (LED) apparatus according to an embodiment of the present disclosure.

Referring to FIG. 1A, an LED apparatus 1000 includes a light emitting diode 10, a light conversion layer 20, a reflection coating layer 30, and a color filter 40.

The light emitting diode 10 means a p-n junction diode emitting light by recombination of excess electron-hole pairs. When a forward voltage is applied to the light emitting diode 10, electrons present in an n-type semiconductor layer meet and are recombined with holes present in a p-type semiconductor layer to emit light.

A case in which the light emitting diode 10 emits blue light will hereinafter be described. However, the light emitting diode 10 is not limited thereto, but may also emit light having another color. A kind of light conversion layer 20 may be changed depending on a color of the light emitted by the light emitting diode 10.

The light conversion layer 20 may be formed of a kind of light emitting material such as a material absorbing energy and emitting light such as red light, green light, blue light, and the like, for example, a phosphor, a quantum dot, and the like.

Particularly, the light conversion layer 20 may be implemented by a quantum dot siloxane resin. In detail, the light conversion layer 20 may be formed of a material bonded to a polymer organic material such as siloxane, epoxy, and the like, and changed from a liquid property of the quantum dot itself into a solid form such as a film That is, the light conversion layer 20 has a structure in which the quantum dot is applied into a siloxane molecule structure robust to heat, and this material may be stacked on the light emitting diode 10 by a spin coating or slit coating process.

In the case in which the light conversion layer 20 is implemented by a quantum dot siloxane resin, synthesis of materials at a low temperature is possible, the siloxane resin may serve to contain the quantum dot therein and block heat and moisture to improve durability of the quantum dot. That is, even though a blocking film for blocking heat generated from the light emitting diode 10 is not present, the light conversion layer 20 may be stacked on the light emitting diode 10 in a state in which it is adjacent to the light emitting diode 10, and damage to the light conversion layer 20 due to the heat generated from the light emitting diode 10 may be prevented.

The light conversion layer 20 may convert a wavelength of light incident from the light emitting diode 10. For example, in the case in which the light emitting diode 10 emits blue light, the light conversion layer 20 may convert the blue light emitted from the light emitting diode 10 into red light or green light and emit the red light or the green light. In the case in which the light conversion layer 20 converts the blue light into the red light and emits the red light, the LED apparatus 1000 may be operated as a red sub-pixel, and in the case in which the light conversion layer 20 converts the blue light into the green light and emits the green light, the LED apparatus 1000 may be operated as a green sub-pixel. In the case in which the light conversion layer 20 is not stacked on the light emitting diode 10, the blue light may be emitted. In this case, the LED apparatus 1000 may be operated as a blue sub-pixel.

The light conversion layer 20 may convert the light incident from the light emitting diode 10 into light having a corresponding wavelength, and diffuse and emit the light of which the wavelength is converted to the outside through a diffusion material included in the light conversion layer 20. That is, a viewing angle may be widened due to the diffusion material included in the light conversion layer 20.

However, the light conversion layer 20 is not limited thereto, but may not include the diffusion material to narrow the viewing angle. For example, in a case of a display that is to be used in a public place, it may be more important to prevent exposure of personal information as compared with the viewing angle. In this case, the diffusion material may not be used.

The reflection coating layer 30 may be stacked on the light conversion layer 20, and may pass the light of which the wavelength is converted in light incident from the light conversion layer 20 therethrough and reflect the other light. For example, the reflection coating layer 30 may be a blue distributed Bragg reflector coating layer, and may reflect the blue light. However, the reflection coating layer 30 is not limited thereto, but may reflect light having other wavelengths depending on the purpose of the LED apparatus 1000.

In this case, the reflection coating layer 30 may be stacked to correspond to the light conversion layer 20. For example, in the case in which the light conversion layer 20 converts light having a blue wavelength into light having a red wavelength, the reflection coating layer 30 may pass the light having the red wavelength therethrough and reflect the light having the blue wavelength. Alternatively, in the case in which the light conversion layer 20 converts light having a blue wavelength into light having a green wavelength, the reflection coating layer 30 may pass the light having the green wavelength therethrough and reflect the light having the blue wavelength.

When the light having the wavelength reflected is again reflected by the light emitting diode 10 and the wavelength is converted by the light conversion layer 20, the reflection coating layer 30 may pass the light of which the wavelength is converted therethrough.

For example, in the case of the LED apparatus 1000 operated as the red sub-pixel, the reflection coating layer 30 may pass only light of which a wavelength is converted into the red wavelength in the light incident from the light conversion layer 20 therethrough, and reflect the light having the blue wavelength. The light having the blue wavelength reflected by the reflection coating layer 30 may again pass through the light conversion layer 20 and be then again reflected by the light emitting diode 10. The light having the blue wavelength again reflected may again pass through the light conversion layer 20, such that the wavelength of the light may be converted, and the LED apparatus 1000 may repeat such a process to emit light having a desired wavelength without loss of the light.

The color filter 40 may be stacked on the reflection coating layer 30. In addition, the color filter 40 may be stacked to correspond to the light conversion layer 20 to pass only light having a predetermined wavelength therethrough. For example, in the case in which the light conversion layer 20 converts the light having the blue wavelength into the light having the red wavelength, the color filter 40 may pass the light having the red wavelength therethrough and filter light having the other wavelengths. Alternatively, in the case in which the light conversion layer 20 converts the light having the blue wavelength into the light having the green wavelength, the color filter 40 may pass the light having the green wavelength therethrough and filter light having the other wavelengths.

The color filter 40 may be a narrow band color filter, and may raise color purity without generating optical loss.

In the case in which a voltage is not applied to the light emitting diode 10, the LED apparatus 1000 should look black, but may also look bright black by light that is incident from the outside and is then again reflected.

The color filter 40 may filter the light incident from the outside and the light again reflected to allow the LED apparatus 1000 to look black even in the case in which the voltage is not applied to the light emitting diode 10. That is, the LED apparatus 1000 may look brighter in the case in which the color filter 40 is not present than in the case in which the color filter 40 is present.

Figure 1B:
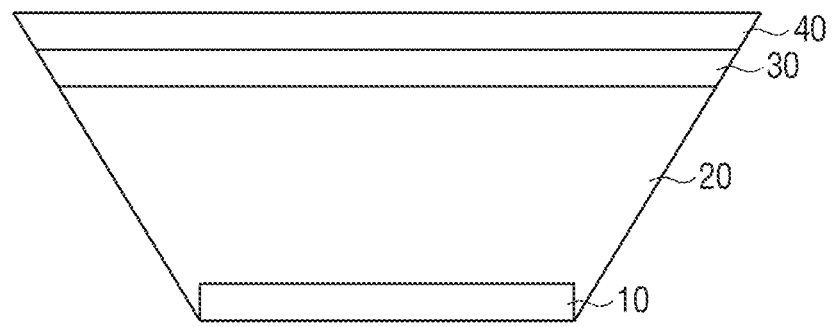

FIG. 1B is a view for describing an LED apparatus 1000 according to an embodiment of the present disclosure.

Referring to FIG. 1B, the LED apparatus 1000 may include a light conversion layer 20 having a trapezoidal shape, and may provide a viewing angle wider than that of the LED apparatus 1000 of FIG. 1A. A detailed description for the LED apparatus 1000 of FIG. 1B will be provided below.

Figure 2A:
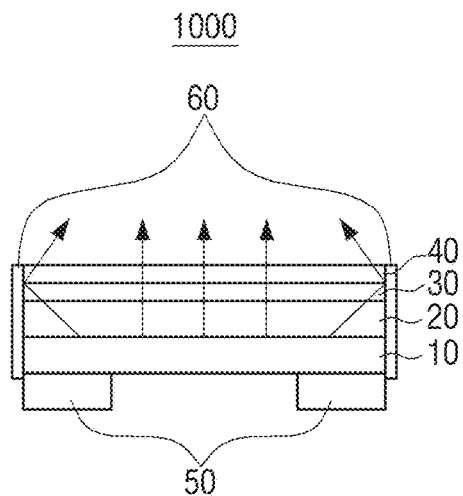
FIG. 2A is a view illustrating detailed components of a LED apparatus illustrated in FIG. 1A according to an embodiment of the present disclosure.

FIG. 2A is a view illustrating detailed components of a LED apparatus illustrated in FIG. 1A according to an embodiment of the present disclosure. A detailed description for components overlapping components illustrated in FIG. 1A among components illustrated in FIG. 2A will be omitted.

Referring to FIG. 2A, the LED apparatus 1000 may further include a plurality of pads 50 and a metallic material 60, in addition to the components illustrated in FIG. 1A.

The plurality of pads 50 may be formed beneath the light emitting diode 10 to receive external power. The respective pads may be connected to the p-type semiconductor layer and the n-type semiconductor layer of the light emitting diode 10, respectively, to apply a voltage to the light emitting diode 10. When the voltage is applied to the light emitting diode 10 through the plurality of pads 50, the light emitting diode 10 may emit light.

The metallic material 60 may be coated to surround side surfaces of the light emitting diode 10, the light conversion layer 20, the reflection coating layer 30, and the color filter 40 to reflect light emitted to the side surfaces of the light emitting diode 10, the light conversion layer 20, the reflection coating layer 30, and the color filter 40 to inner portions of the light emitting diode 10, the light conversion layer 20, the reflection coating layer 30, and the color filter 40.

However, the metallic material 60 is not limited thereto, but may also be coated to surround the plurality of pads 50.

That is, the metallic material 60 may allow light of adjacent light emitting diodes 10 not to be mixed with each other, and raise a brightness of the LED apparatus 1000.

The metallic material 60 may be implemented by aluminum, molybdenum, titanium, and the like. However, the metallic material 60 is not limited thereto, but may be implemented by any material that may reflect the light.

The metallic material 60 may totally reflect incident light, or the reflection coating layer 30 may reflect only light corresponding to some wavelengths in incident light.

Figure 2B:
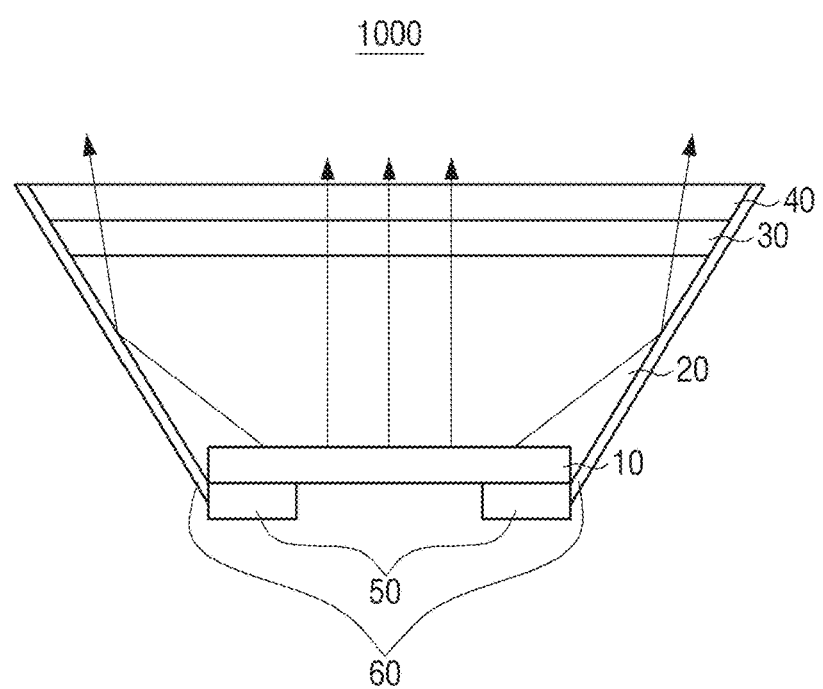
FIG. 2B is a view illustrating detailed components of the LED apparatus illustrated in FIG. 1B according to an embodiment of the present disclosure.

FIG. 2B is a view illustrating detailed components of a LED apparatus illustrated in FIG. 1B according to an embodiment of the present disclosure, and may provide a viewing angle wider than that of the LED apparatus 1000 of FIG. 2A due to a light conversion layer 20 having a trapezoidal shape.

In the LED apparatus 1000 of FIG. 2A, the metallic material 60 is formed in a vertical direction, and when the light emitted from the light emitting diode 10 is reflected by the metallic material 60, the reflected light may be collected.

Referring to FIG. 2B, in the LED apparatus 1000, the metallic material 60 is formed in an inclined state, and even though light emitted from the light emitting diode 10 is reflected by the metallic material 60, the reflected light may be emitted toward the outside of the light emitting diode 10. Therefore, the LED apparatus 1000 of FIG. 2B may provide a viewing angle wider than that of the LED apparatus 1000 of FIG. 2A.

In the LED apparatus 1000 having the structure as described above, a board, a mold, a gold wire, and the like, are removed, such that a cost may be reduced. In addition, the light conversion layer 20 in which a deterioration phenomenon is suppressed is used, such that the light conversion layer 20 may be directly stacked on the light emitting diode 10 and the LED apparatus 1000 may be produced at a smaller size and a thinner thickness.

FIG. 3 is a view for describing an LED apparatus according to an embodiment of the present disclosure.

Referring to FIG. 3, is a case in which some components are added to the LED apparatus 1000 illustrated in FIG. 2A. A detailed description for components overlapped with components illustrated in FIG. 2A among components illustrated in FIG. 3 will be omitted. The LED apparatus 1000 may further include a substrate layer 70, a polyimide layer 80, a plurality of extension pads 90, and a plurality of conductive materials 95.

The substrate layer 70 may be formed beneath the light emitting diode 10, the plurality of pads 50, and the polyimide layer 80. The polyimide layer 80 may be formed to surround the metallic material 60. In addition, the polyimide layer 80 may also be formed to surround outer sides of the plurality of pads 50.

The substrate layer 70 may be formed adjacently to the plurality of pads 50 and the polyimide layer 80, but may not be adjacent to the light emitting diode 10.

The plurality of extension pads 90 may be formed beneath the substrate layer 70 to be spaced apart from each other. The plurality of extension pads 90 may be connected to the plurality of pads 50 through the plurality of conductive materials 95.

The plurality of conductive materials 95 may connect each of the plurality of pads 50 to each of the plurality of extension pads 90 through the substrate layer 70. A plurality of holes in which the plurality of conductive materials 95 may be accommodated may be formed in the substrate layer 70.

The plurality of pads 50, the plurality of extension pads 90, and the plurality of conductive materials 95 may be formed of conductors. For example, the plurality of pads 50, the plurality of extension pads 90, and the plurality of conductive materials 95 may be formed of copper, gold, silver, and the like.

Each of the plurality of extension pads 90 may correspond to each of the plurality of pads 50, and may be extended up to some regions of the polyimide layer 80. That is, the plurality of extension pads 90 may have a size greater than that of the plurality of pads 50.

The LED apparatus 1000 as illustrated in FIGS. 2A and 2B may have a width of about 30 μm, but the LED apparatus 1000 having a width of about 500 μm may be formed by adding the polyimide layer 80, and the like, as illustrated in FIG. 3. That is, the LED apparatus 1000 as illustrated in FIGS. 2A and 2B has a very small size, such that it is difficult to mount the LED apparatus 1000 as illustrated in FIGS. 2A and 2B. However, in the case in which the width is extended as illustrated in FIG. 3, the LED apparatus may be easily bonded in spite of using an equipment such as an existing surface mount technology (SMT) equipment, and the like.

FIG. 3 is a view illustrating the case in which some components are added to the LED apparatus 1000 illustrated in FIG. 2A, but is not limited thereto. For example, the LED apparatus 1000 as illustrated in FIG. 3 may also be formed by adding the same components to the LED apparatus 1000 of FIG. 2B.

A manufacturing method of an LED apparatus 1000 according to the present disclosure will hereinafter be described.

Terms such as "deposition", "growth", "stacking", and the like, used below are used as the same meaning as the meaning that semiconductor material layers are formed, and layers or thin films formed through diverse embodiments of the present disclosure may be grown in a growth chamber by a metal-organic chemical vapor deposition (MOCVD) method or a molecular beam epitaxy (MBE) method, or may be deposited and formed by various methods such as a plasma-enhanced chemical vapor deposition (PECVD) method, an atmospheric pressure chemical vapor deposition (APCVD) method, a low pressure chemical vapor deposition (LPCVD) method, an ultrahigh vacuum chemical vapor deposition (UHCVD) method, a physical vapor deposition (PVD) method, an electron beam method, a resistance heating method, and the like.

FIGS. 4A to 4K are views for describing a manufacturing method of an LED apparatus according to an embodiment of the present disclosure.

Figure 4A:
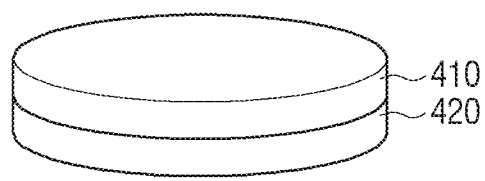
FIGS. 4A, 4B, 4C, 4D, 4E, 4F, 4G, 4H, 4I, 4J and 4K are views for describing a manufacturing method of an LED apparatus according to an embodiment of the present disclosure.

Referring to FIG. 4A, a light emitting diode layer 420 may be formed beneath a sapphire substrate layer 410. A semiconductor material may be grown on an upper surface of the sapphire substrate layer 410. Particularly, a nitride layer having a hexagonal crystal system may be grown on the sapphire substrate layer 410.

However, the light emitting diode layer 420 may be formed on the sapphire substrate layer 410 in an actual manufacturing process. In addition, although a p-type semiconductor layer and an n-type semiconductor layer are illustrated without being distinguished from each other in FIG. 4A, the p-type semiconductor layer and the n-type semiconductor layer may be sequentially formed in the actual manufacturing process. However, a sequence in which the p-type semiconductor layer and the n-type semiconductor layer are stacked is unrelated to the present disclosure, and any layer may be first stacked.

A GaN layer may be grown on the sapphire substrate layer 410 to form the light emitting diode layer 420. The light emitting diode layer 420 may emit blue light. However, the light emitting diode layer 420 is not limited thereto, but may be formed of any material that may form the light emitting diode layer 420.

Figure 4B:
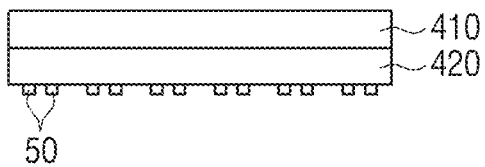

Referring to FIG. 4B, a plurality of pads 50 may be provided beneath the light emitting diode layer 420. In detail, the light emitting diode layer 420 may be divided into a plurality of regions that are predetermined, and the plurality of pads 50 may be provided in the plurality of regions, respectively.

For example, the light emitting diode layer 420 may be divided into a predetermined number of rows and columns to form a plurality of regions, and the plurality of pads 50 may be formed in the plurality of regions, respectively. The plurality of pads 50 may be two pads of a positive electrode and a negative electrode.

Figure 4C:
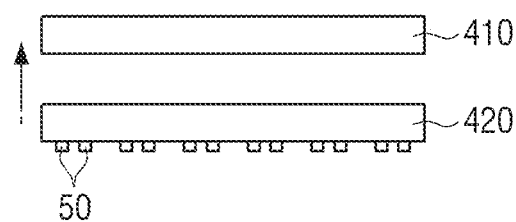

Referring to FIG. 4C, the sapphire substrate layer 410 may be removed from the light emitting diode layer 420. That is, the sapphire substrate layer 410 may be used for growth of the light emitting diode layer 420, and be then removed. For example, the sapphire substrate layer 410 may be removed through laser or chemical etching.

Figure 4D:
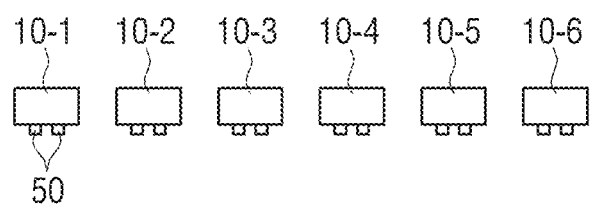

Referring to FIG. 4D, the light emitting diode layer 420 may be diced into a plurality of regions to form a plurality of light emitting diodes 10-1 to 10-6. For example, the light emitting diode layer 420 may be diced so that each of the plurality of light emitting diodes 10-1 to 10-6 includes two pads.

Although a case in which the light emitting diode layer 420 is divided into six light emitting diodes is illustrated in FIG. 4D, this is only an example, and the light emitting diode layer 420 may also be divided into other number of light emitting diodes. In addition, although the light emitting diode layer 420 is diced in a vertical axis direction on the drawing for convenience of explanation, the light emitting diode layer 420 may be diced in a horizontal axis direction.

Figure 4E:
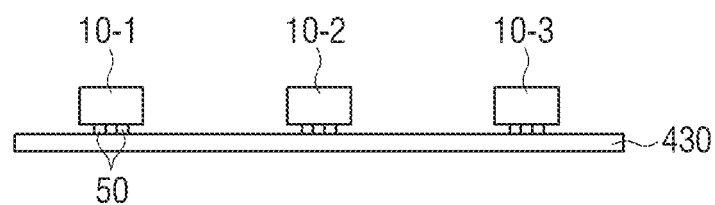

Referring to FIG. 4E, the plurality of light emitting diodes 10-1 to 10-6 may be stacked on a substrate layer 430 so that the plurality of pads 50 are in contact with an upper portion of the substrate layer 430. In detail, the plurality of light emitting diodes 10-1 to 10-6 may be stacked on the substrate layer 430 to be spaced apart from each other by a predetermined interval. The substrate layer 430 may be a substrate layer separate from the sapphire substrate layer 410.

The predetermined interval may be determined depending on the purpose. For example, in the case in which the light emitting diodes are individually used, the predetermined interval may be widened to extend an area occupied by one light emitting diode. A method for extending the area will be described below.

Alternatively, the plurality of light emitting diodes 10-1 to 10-6 may be used as a display. In this case, the predetermined interval may be narrowed to improve a resolution. Therefore, an area occupied by one light emitting diode may be reduced.

Figure 4F:
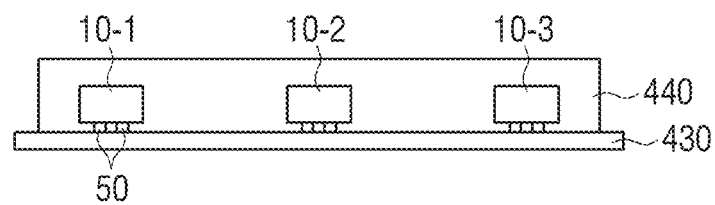

Referring to FIG. 4F, a light conversion layer 440 may be stacked on the plurality of light emitting diodes 10-1 to 10-6. In detail, the light conversion layer 440 may be stacked to cover the plurality of light emitting diodes 10-1 to 10-6 and an upper region of the substrate layer 430 between the plurality of light emitting diodes 10-1 to 10-6. In this case, the plurality of pads 50 may also be covered with the light conversion layer 440.

The light conversion layer 440 may be implemented by a quantum dot siloxane resin. In addition, the light conversion layer 440 may convert light incident from the light emitting diodes into light having corresponding wavelengths, and diffuse and emit the light of which the wavelengths are converted to the outside through a diffusion material included in the light conversion layer 440.

Figure 4G:
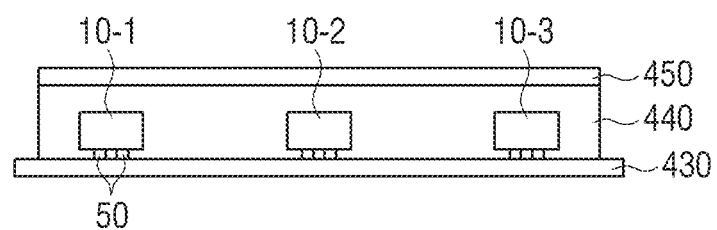

Referring to FIG. 4G, a reflection coating layer 450 may be stacked on the light conversion layer 440. The reflection coating layer 450 may pass the light of which the wavelengths are converted in light incident from the light conversion layer 440 therethrough and reflect the other light, and when the light having the wavelengths reflected is again reflected by the light emitting diodes and the wavelengths are converted by the light conversion layer, the reflection coating layer 450 may pass the light of which the wavelengths are converted therethrough.

Figure 4H:
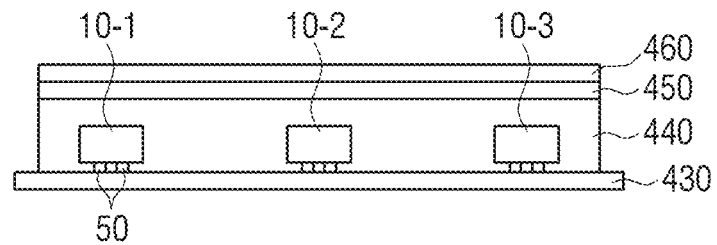

Referring to FIG. 4H, a color filter 460 may be stacked on the reflection coating layer 450. However, the present disclosure is not limited thereto. That is, the color filter 460 may also not be stacked.

Figure 4I:
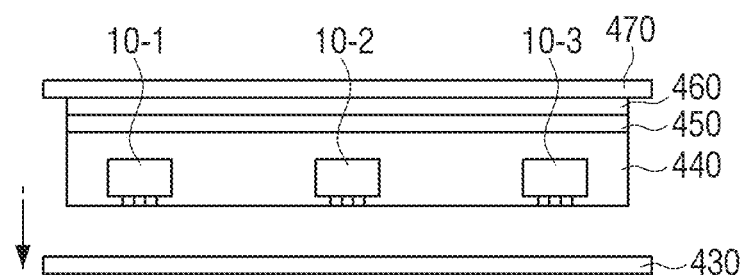

Referring to FIG. 4I, an upper substrate layer 470 may be stacked on the color filter 460, and the substrate layer 430 may be removed. This is to consider an etching form to be described below.

Figure 4J:
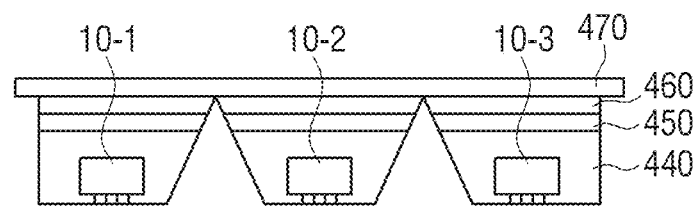

Referring to FIG. 4J, the light conversion layer 440, the reflection coating layer 450, and the color filter 460 corresponding to some regions between the plurality of light emitting diodes 10-1 to 10-6 may be etched. Particularly, some regions between the plurality of light emitting diodes 10-1 to 10-6 may be etched in a ∧ form.

The substrate layer 430 needs to be removed to perform the etching in such a form. The reason is that in the case in which the etching is performed toward the color filter 460 without removing the substrate layer 430, the deeper the depth, the greater the width at which the etching needs to be performed, which is physically impossible.

A case in which the etching is performed so that the plurality of pads 50 or the light emitting diodes are not exposed is illustrated in FIG. 4J. However, the etching is not limited thereto, but may also be performed so that the plurality of pads 50 or the light emitting diodes are exposed. In addition, the etching may also be performed so that the upper substrate layer 470 is further exposed.

Figure 4K:
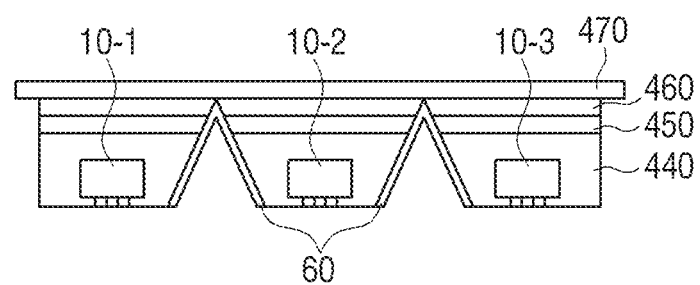

Referring to FIG. 4K, a surface formed by the etching may be coated with a metallic material 60.

In addition, the metallic material 60 may be formed on the surface formed by the etching through sputtering. The sputtering, which is a kind of vacuum deposition method, indicates a method of accelerating gas such as argon, and the like, ionized by generating plasma at a relatively low vacuum level to collide the gas with a target, thereby discharging target atoms to form a film on a substrate in the vicinity of the target atoms.

However, the metallic material 60 is not limited thereto, but may be formed by any method capable of coating the surface formed by the etching.

The metallic material 60 may suppress light from being emitted through the surface formed by the etching, and improve a brightness of the LED apparatus 1000.

The upper substrate layer 470 may be removed, and the light emitting diodes may be individually used. Alternatively, a new substrate layer is formed at a lower portion, and the upper substrate layer 470 is removed, such that the light emitting diodes may be used together. In the case in which the plurality of light emitting diodes 10-1 to 10-6 are individually used, the plurality of light emitting diodes 10-1 to 10-6 may be used in a state in which areas thereof are extended, and a detailed manufacturing method therefor will be described below.

FIGS. 5A to 5I are views for describing a manufacturing method of an LED apparatus according to an embodiment of the present disclosure.

Figure 5A:
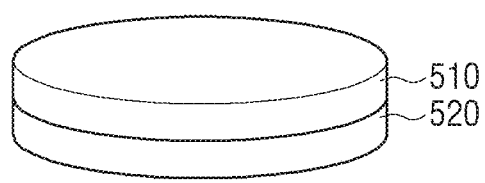
FIGS. 5A, 5B, 5C, 5D, 5E, 5F, 5G, 5H and 5I are views for describing a manufacturing method of an LED apparatus according to an embodiment of the present disclosure.

Referring to FIG. 5A, a light emitting diode layer 520 may be formed beneath a sapphire substrate layer 510. However, the light emitting diode layer 520 may be formed on the sapphire substrate layer 510 in an actual manufacturing process. In addition, although a p-type semiconductor layer and an n-type semiconductor layer are illustrated without being distinguished from each other in FIG. 5A, the p-type semiconductor layer and the n-type semiconductor layer may be sequentially formed in the actual manufacturing process. However, a sequence in which the p-type semiconductor layer and the n-type semiconductor layer are stacked is unrelated to the present disclosure, and any layer may be first stacked.

A GaN layer may be grown on the sapphire substrate layer 510 to form the light emitting diode layer 520. The light emitting diode layer 520 may emit blue light. However, the light emitting diode layer 520 is not limited thereto, but may be formed of any material that may form the light emitting diode layer 420.

Figure 5B:
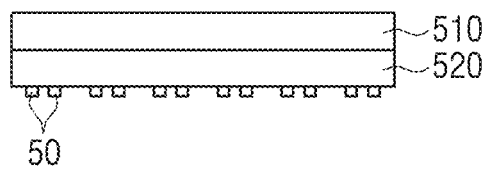

Referring to FIG. 5B, a plurality of pads 50 may be provided beneath the light emitting diode layer 520. In detail, the light emitting diode layer 520 may be divided into a plurality of regions that are predetermined, and the plurality of pads 50 may be provided in the plurality of regions, respectively.

For example, the light emitting diode layer 520 may be divided into a predetermined number of rows and columns to form a plurality of regions, and the plurality of pads 50 may be formed in the plurality of regions, respectively. The plurality of pads 50 may be two pads of a positive electrode and a negative electrode.

Figure 5C:
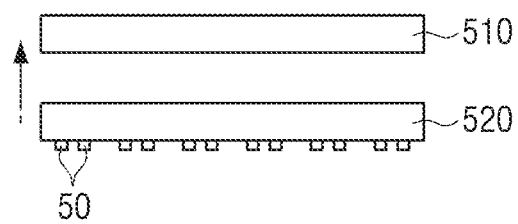

Referring to FIG. 5C, the sapphire substrate layer 510 may be removed from the light emitting diode layer 520. That is, the sapphire substrate layer 510 may be used for growth of the light emitting diode layer 520, and be then removed.

Figure 5D:
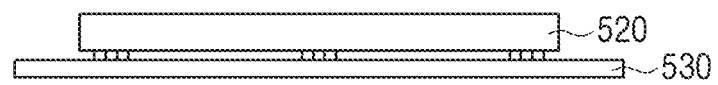

Referring to FIG. 5D, the light emitting diode layer 520 may be stacked on a substrate layer 530 so that the plurality of pads 50 are in contact with an upper portion of the substrate layer. In detail, the light emitting diode layer 520 may be stacked on the substrate layer 530 so that the plurality of pads 50 provided in the plurality of regions, respectively, are in contact with the upper portion of the substrate layer 530.

Figure 5E:
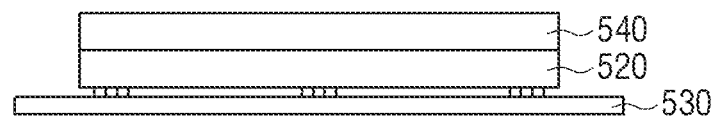
Figure 5F:
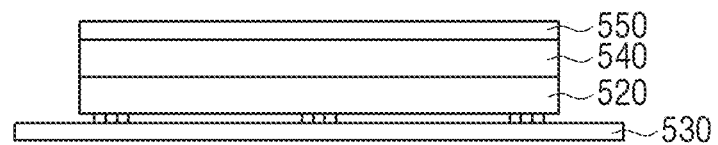
Figure 5G:
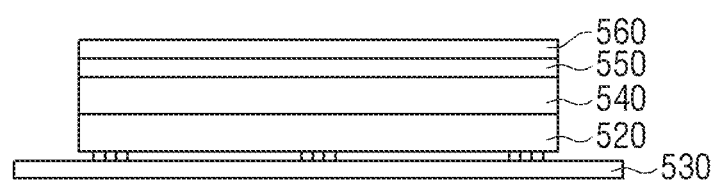

Referring to FIGS. 5E to 5G, a light conversion layer 540 may be stacked on the light emitting diode layer 520, a reflection coating layer 550 may be stacked on the light conversion layer 540, and a color filter 560 may be stacked on the reflection coating layer 550.

Figure 5H:
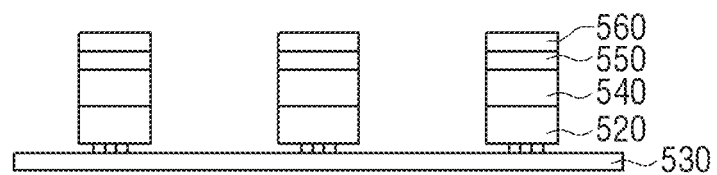

Referring to FIG. 5H, the light emitting diode layer 520, the light conversion layer 540, the reflection coating layer 550, and the color filter 560 corresponding to boundary regions between the plurality of regions may be etched. For example, the light emitting diode layer 520, the light conversion layer 540, the reflection coating layer 550, and the color filter 560 corresponding to regions in predetermined distances on the basis of boundaries between the plurality of regions may be etched.

Figure 5I:
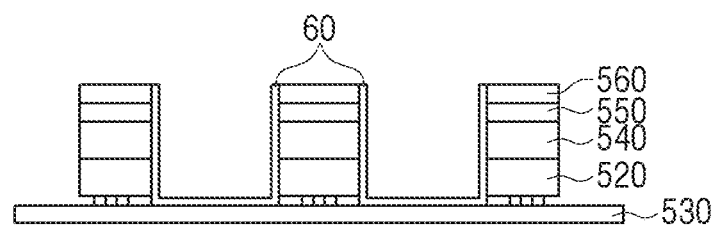

Referring to FIG. 5I, a surface formed by the etching may be coated with a metallic material 60.

Although a case in which the sapphire substrate layer is used is described in FIGS. 4A to 4K and FIGS. 5A to 5I, the present disclosure is not limited thereto. For example, the light emitting diode layer may be formed on a silicon substrate layer instead of the sapphire substrate layer.

In addition, the sapphire substrate layer may be partially removed or may not be removed. In this case, heat generated from the light emitting diode layer due to the light emitting diode layer and the light conversion layer spaced apart from each other may be partially blocked.

Only FIGS. 4A and 5A of FIGS. 4A to 4K and FIGS. 5A to 5I are illustrated as perspective views, and the other drawings of FIGS. 4A to 4K and FIGS. 5A to 5I are illustrated as front views. However, this is for convenience of explanation, and manufacturing may be three-dimensionally performed even in a method illustrated by plan views. For example, dicing in a horizontal direction and a vertical direction may be performed in a process of dicing the substrate layer.

FIGS. 6A to 6E are views for describing a method of forming a plurality of extension pads according to an embodiment of the present disclosure.

Figure 6A:
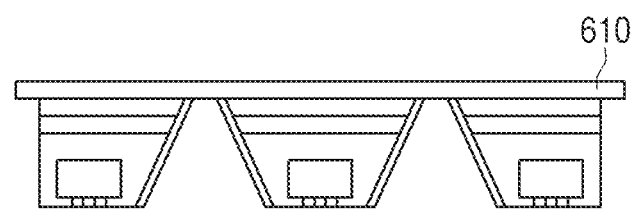
FIGS. 6A, 6B, 6C, 6D and 6E are views for describing a method of forming a plurality of extension pads according to an embodiment of the present disclosure.

Referring to FIG. 6A, the LED apparatus 1000 prepared in FIG. 4K is illustrated. However, a case in which the etching is further performed as compared with the LED apparatus 1000 prepared in FIG. 4K is illustrated. In addition, a state of FIG. 6A is a state in which the etching is performed so that an upper substrate layer 610 is exposed to inject a polyimide solution to be described below.

Figure 6B:
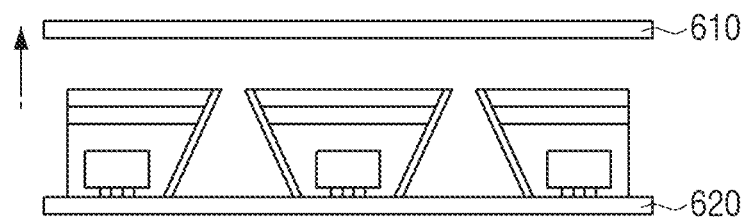

Referring to FIG. 6B, a lower substrate layer 620 may be formed beneath the plurality of light emitting diodes, and the upper substrate layer 610 may be removed.

Figure 6C:
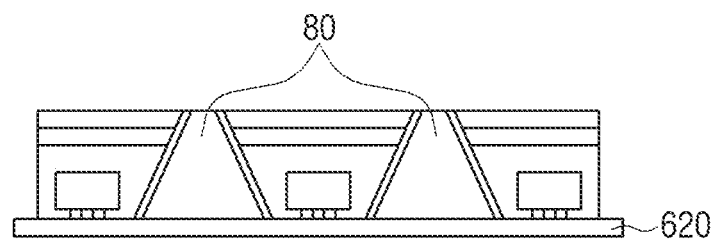

Referring to FIG. 6C, a polyimide layer 80 may be formed to surround the metallic material and fill some regions between the plurality of light emitting diodes. When the upper substrate layer 610 is removed by performing the etching so that the upper substrate layer 610 is exposed as described above, a space into which the polyimide solution may be injected may be prepared.

Figure 6D:
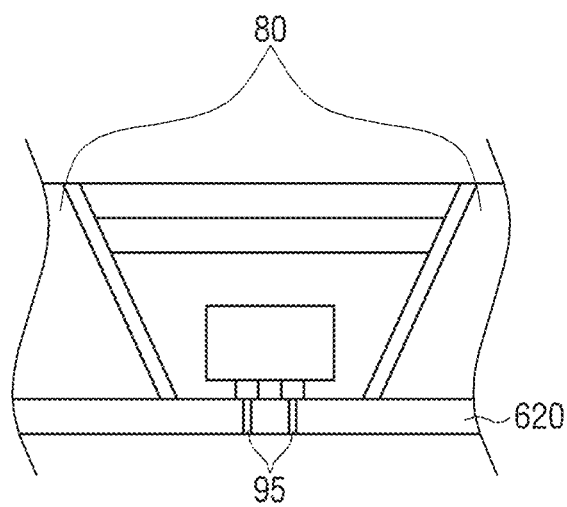

Referring to FIG. 6D, when the polyimide solution is injected, a plurality of holes may be formed in the lower substrate layer 620 so that some regions of each of the plurality of pads are exposed. For example, the plurality of holes may be formed in the lower substrate layer 620 using etching, laser, or the like. In addition, conductive material 95 may be filled in the plurality of holes, respectively.

Figure 6E:
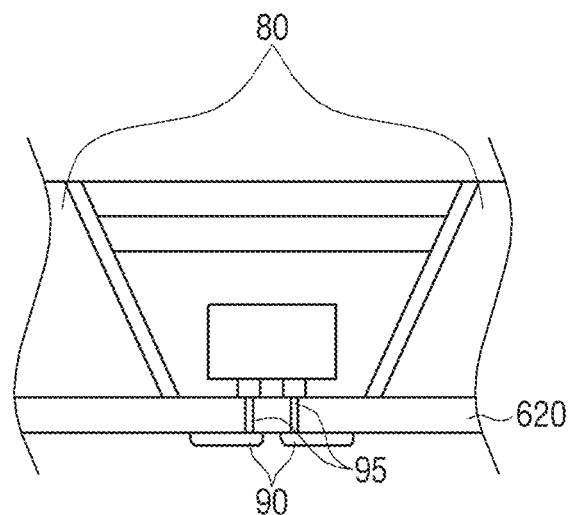

Referring to FIG. 6E, a plurality of extension pads 90 formed to be spaced apart from each other and cover the plurality of conductive materials, respectively, may be provided beneath the lower substrate layer 620.

In addition, dicing may be performed on the basis of the center of a region into which the polyimide solution is injected to manufacture the LED apparatus 1000 including the plurality of extension pads 90 as illustrated in FIG. 3. For example, the dicing may be performed on the basis of the center of a region into which the polyimide solution is injected using laser, a blade, or etching to manufacture the LED apparatus 1000 including the plurality of extension pads 90 as illustrated in FIG. 3.

Figure 7A:
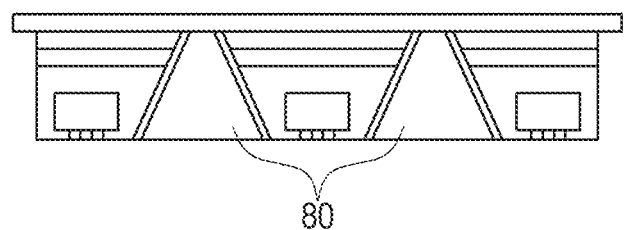
FIGS. 7A and 7B are views for describing a method of forming extension pads according to an embodiment of the present disclosure.
Figure 7B:
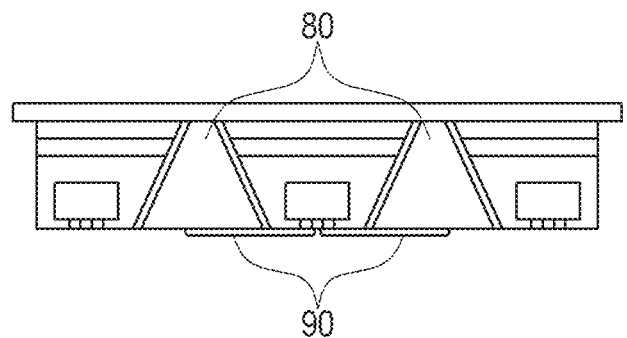

FIGS. 7A and 7B are views for describing a method of forming extension pads according to an embodiment of the present disclosure.

Referring to FIG. 7A, a polyimide layer 80 may be formed to surround the metallic material and fill some regions between the plurality of light emitting diodes, in a structure of FIG. 6A.

Referring to FIG. 7B, the plurality of extension pads 90 corresponding to the plurality of pads, respectively, and extended up to some regions of the polyimide layer 80 may be provided.

However, the present disclosure is not limited thereto. That is, a substrate layer may be formed beneath the plurality of light emitting diodes, and the plurality of extension pads 90 may be provided. The substrate layer may include a plurality of conductive materials 95 each connecting the plurality of pads to the plurality of extension pads 90.

Likewise, dicing may be performed on the basis of the center of a region into which the polyimide solution is injected to manufacture the LED apparatus 1000 including the plurality of extension pads 90 as illustrated in FIG. 3.

A case in which a structure similar to that illustrated in FIG. 4K is used is described in FIGS. 6A to 6E and FIGS. 7A and 7B, a similar method may be applied to a structure illustrated in FIG. 5I. For example, in the structure illustrated in FIG. 5I, the polyimide solution may be injected, the holes may be formed in the substrate layer and be filled with the conductive material, and the plurality of extension pads may be formed beneath the substrate layer.

Figure 8:
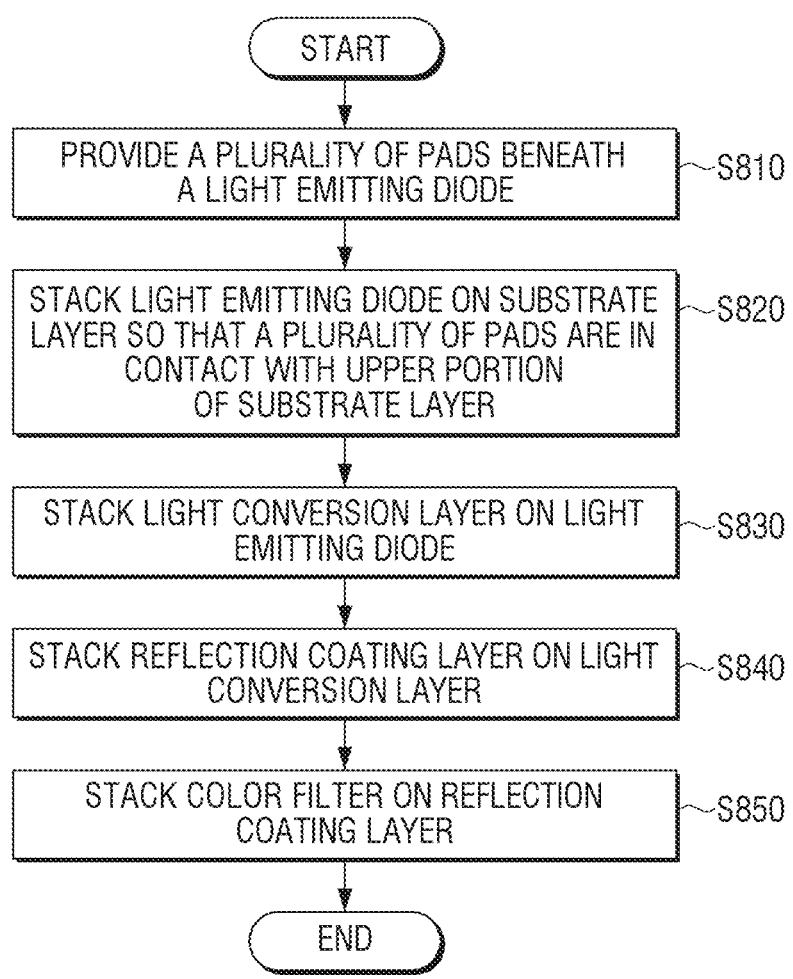
FIG. 8 is a flowchart for describing a manufacturing method of an LED apparatus according to an embodiment of the present disclosure.

FIG. 8 is a flowchart for describing a manufacturing method of an LED apparatus according to an embodiment of the present disclosure.

First, the plurality of pads are provided beneath the light emitting diode in operation S810. The light emitting diode may be stacked on the substrate layer so that the plurality of pads are in contact with the upper portion of the substrate layer operation S820. The light conversion layer is stacked on the light emitting diode operation S830. The reflection coating layer is stacked on the light conversion layer in operation S840. The color filter is stacked on the reflection coating layer in operation S850.

The light conversion layer may be implemented by the quantum dot siloxane resin.

In addition, the light conversion layer may convert light incident from the light emitting diode into light having a corresponding wavelength, and diffuse and emit the light of which the wavelength is converted to the outside through the diffusion material included in the light conversion layer.

In addition, the reflection coating layer may pass the light of which the wavelength is converted in light incident from the light conversion layer therethrough and reflect the other light, and when the light having the wavelength reflected is again reflected by the light emitting diode and the wavelength is converted by the light conversion layer, the reflection coating layer may pass the light of which the wavelength is converted therethrough.

The manufacturing method of an LED apparatus may further include forming the light emitting diode layer beneath the sapphire substrate layer. In the providing in operation S810 of the plurality of pads, the light emitting diode layer is divided into the plurality of regions that are predetermined and the plurality of pads are provided in the plurality of regions, respectively, and the manufacturing method of an LED apparatus may further include removing the sapphire substrate layer from the light emitting diode layer, and dicing the light emitting diode layer into the plurality of regions to form the plurality of light emitting diodes. In the stacking in operation S820 of the light emitting diode on the substrate layer, the plurality of light emitting diodes are stacked on the substrate layer to be spaced apart from each other by a predetermined interval.

In the stacking in operation S830 of the light conversion layer, the light conversion layer is stacked to cover the plurality of light emitting diodes and the upper region of the substrate layer between the plurality of light emitting diodes, and the manufacturing method of an LED apparatus may further include stacking the upper substrate layer on the color filter and removing the substrate layer, etching the light conversion layer, the reflection coating layer, and the color filter corresponding to some regions between the plurality of light emitting diodes, and coating the surface formed by the etching with the metallic material.

In addition, in the etching, some regions between the plurality of light emitting diodes may be etched in the ∧ form.

In addition, the manufacturing method of an LED apparatus may further include forming the lower substrate layer beneath the plurality of light emitting diodes and removing the upper substrate layer, forming the polyimide layer to surround the metallic material and fill some regions between the plurality of light emitting diodes, forming the plurality of holes in the lower substrate layer so that some regions of each of the plurality of pads are exposed, filling the plurality of conductive materials in the plurality of holes, respectively, and providing the plurality of extension pads beneath the lower substrate layer, the plurality of extension pads being formed to be spaced apart from each other and cover conductive material, respectively.

The manufacturing method of an LED apparatus may further include forming the polyimide layer to surround the metallic material and fill some regions between the plurality of light emitting diodes, and providing the plurality of extension pads corresponding to the plurality of pads, respectively, and extended up to some regions of the polyimide layer.

The manufacturing method of an LED apparatus may further include forming the light emitting diode layer beneath the sapphire substrate layer. In the providing in operation S810 of the plurality of pads, the light emitting diode layer is divided into the plurality of regions that are predetermined and the plurality of pads are provided in the plurality of regions, respectively, and the manufacturing method of an LED apparatus may further include removing the sapphire substrate layer from the light emitting diode layer. In the stacking in operation S820 of the light emitting diode on the substrate layer, the light emitting diode layer is stacked on the substrate layer so that the plurality of pads provided in the plurality of regions, respectively, are in contact with the upper portion of the substrate layer.

The manufacturing method of an LED apparatus may further include etching the light emitting diode layer, the light conversion layer, the reflection coating layer, and the color filter corresponding to the boundary regions between the plurality of regions, and coating the surface formed by the etching with the metallic material.

As described above, according to the diverse embodiments of the present disclosure, the light conversion layer in which the deterioration phenomenon is suppressed is used, such that a lifespan of the LED apparatus may be increased and the LED apparatus may be produced at a smaller size and a thinner thickness, thereby making it possible to implement a display having a high resolution.

The methods according to the diverse embodiments described above may be programmed and stored in various storage media. Therefore, the methods according to the diverse embodiments described above may be implemented in various types of electronic apparatuses executing the storage media.

In detail, a non-transitory computer readable medium in which a program sequentially performing the methods described above is stored may be provided.

The non-transitory computer readable medium is not a medium that stores data therein for a while, such as a register, a cache, a memory, or the like, but means a medium that semi-permanently stores data therein and is readable by a device. In detail, various applications or programs described above may be stored and provided in the non-transitory computer readable medium such as a compact disc (CD), a digital versatile disc (DVD), a hard disk, a Blu-ray disc, a universal serial bus (USB), a memory card, a read only memory (ROM), or the like.

While the present disclosure has been shown and described with reference to various embodiments thereof, it will be understood by those skilled in the art that various changes in form and details may be made therein without departing from the spirit and scope of the disclosure as defined the appended claims and their equivalents.

What is claimed is:

1. A light emitting diode (LED) apparatus comprising:
   a light emitting diode configured to emit blue light;
   a light conversion layer stacked on top of the light emitting diode and configured to convert a wavelength of the blue light incident from the light emitting diode;
   a reflection coating layer stacked on top of the light conversion layer and configured to pass a first light of which the wavelength is converted by the light conversion layer therethrough and to reflect a second light of which the wavelength is not converted; and
   a color filter stacked on top of the reflection coating layer and configured to correspond to the light conversion layer,
   wherein the light conversion layer is a quantum dot.

2. The LED apparatus as claimed in claim 1, wherein the light conversion layer is further configured to:
   convert the blue light incident from the light emitting diode into the first light having a corresponding wavelength, and
   diffuse and emit the first light of which the wavelength is converted to the outside through a diffusion material included in the light conversion layer.

3. The LED apparatus as claimed in claim 1, wherein, when the second light, reflected by the reflection coating layer, is again reflected by the light emitting diode and a wavelength of the second light is converted by the light conversion layer, the reflection coating layer is further configured to pass the second light of which the wavelength is converted therethrough.

4. The LED apparatus as claimed in claim 1, further comprising a plurality of pads formed beneath the light emitting diode.

5. The LED apparatus as claimed in claim 4, further comprising a metallic material coated to surround side surfaces of the light emitting diode, the light conversion layer, the reflection coating layer, and the color filter to reflect light emitted to the side surfaces of the light emitting diode, the light conversion layer, the reflection coating layer, and the color filter to inner portions of the light emitting diode, the light conversion layer, the reflection coating layer, and the color filter.

6. The LED apparatus as claimed in claim 5, further comprising:
   a polyimide layer formed to surround the metallic material,
   a substrate layer formed beneath the light emitting diode, the plurality of pads, and the polyimide layer,
   a plurality of extension pads formed beneath the substrate layer to be spaced apart from each other, and
   a plurality of conductive materials connecting each of the plurality of pads to each of the plurality of extension pads through the substrate layer.

7. The LED apparatus as claimed in claim 6, wherein each of the plurality of extension pads corresponds to each of the plurality of pads, and is extended up to some regions of the polyimide layer.

8. The LED apparatus as claimed in claim 1, wherein the light conversion layer is formed of a quantum dot siloxane resin.

* * * * *